United States Patent
Hetherington

(10) Patent No.: US 9,210,505 B2
(45) Date of Patent: Dec. 8, 2015

(54) MAINTAINING SPATIAL STABILITY UTILIZING COMMON GAIN COEFFICIENT

(71) Applicant: QNX Software Systems Limited, Kanata (CA)

(72) Inventor: Phillip Alan Hetherington, Port Moody (CA)

(73) Assignee: 2236008 Ontario Inc., Waterloo, Ontario (CA)

( * ) Notice: Subject to any disclaimer, the term of this patent is extended or adjusted under 35 U.S.C. 154(b) by 366 days.

(21) Appl. No.: 13/753,211

(22) Filed: Jan. 29, 2013

(65) Prior Publication Data

US 2014/0211954 A1  Jul. 31, 2014

(51) Int. Cl.
| H04R 3/00 | (2006.01) |
| H03G 3/00 | (2006.01) |
| H04R 3/02 | (2006.01) |
| H04S 7/00 | (2006.01) |
| H04M 9/08 | (2006.01) |
| H03G 3/32 | (2006.01) |

(52) U.S. Cl.
CPC ........... *H04R 3/02* (2013.01); *H04M 9/082* (2013.01); *H04S 7/30* (2013.01); *H03G 3/001* (2013.01); *H03G 3/32* (2013.01)

(58) Field of Classification Search
None
See application file for complete search history.

(56) References Cited

U.S. PATENT DOCUMENTS

| 2002/0193130 A1* | 12/2002 | Yang et al. ............... 455/501 |
| 2011/0313763 A1* | 12/2011 | Amada ..................... 704/233 |
| 2013/0054231 A1* | 2/2013 | Jeub et al. ................ 704/226 |

FOREIGN PATENT DOCUMENTS

WO    WO 2009/096958 A1    8/2009

OTHER PUBLICATIONS

Le Bouquin Jeannés et al.; "Combined Noise and Echo Reduction in Hands-Free Systems: A Survey"; IEEE Transactions on Speech and Audio Processing, vol. 9, No. 8; Nov. 2001; pp. 808-820.

* cited by examiner

*Primary Examiner* — Andrew L Sniezek
(74) *Attorney, Agent, or Firm* — Brinks Gilson & Lione

(57) ABSTRACT

In a system and method for maintaining the spatial stability of a sound field a background noise estimate may be estimated for each of a first signal and a second signal. A first gain coefficient may be calculated responsive to the first audio signal and the background noise estimate of the first audio signal. A second gain coefficient may be calculated responsive to the second signal and the background noise estimate of the second signal. The gain coefficients may be calculated using one or more gain coefficient calculators. A common gain coefficient may be selected from one of the first gain coefficient and the second gain coefficient. The selected common gain coefficient may be one that results in a least amount of audio signal modification and may be applied to each of the first signal and the second signal.

18 Claims, 4 Drawing Sheets

MAINTAINING SPATIAL STABILITY UTILIZING COMMON GAIN COEFFICIENT

BACKGROUND

1. Technical Field

The present disclosure relates to the field of processing sound fields. In particular, to a system and method for maintaining the spatial stability of a sound field utilizing a common gain coefficient.

2. Related Art

Stereo and multichannel audio configurations may be used for processing a sound field that is a spatial representation of an audible environment. The processed sound field may be used to reproduce the audible environment using audio transducers.

Many computing devices may have multiple integrated microphones used for recording an audible environment associated with the computing device and communicating with other users. Computing devices typically use multiple microphones to improve noise performance with noise suppression processes. The noise suppression processes may result in the reduction or loss of spatial information. In many cases the noise suppression processing may result in a single, or mono, output signal that has no spatial information.

BRIEF DESCRIPTION OF DRAWINGS

The system may be better understood with reference to the following drawings and description. The components in the figures are not necessarily to scale, emphasis instead being placed upon illustrating the principles of the disclosure. Moreover, in the figures, like referenced numerals designate corresponding parts throughout the different views.

Other systems, methods, features and advantages will be, or will become, apparent to one with skill in the art upon examination of the following figures and detailed description. It is intended that all such additional systems, methods, features and advantages be included with this description and be protected by the following claims.

DETAILED DESCRIPTION

In a system and method for maintaining the spatial stability of a sound field a background noise estimate may be estimated for each of a first audio signal and a second audio signal. A first gain coefficient may be calculated responsive to the first audio signal and the background noise estimate of the first audio signal. Gain coefficients may be calculated using a gain coefficient calculator that may include one or more of an automatic gain controller, a noise suppressor and an echo canceller. A second gain coefficient may be calculated responsive to the second audio signal and the background noise estimate of the second audio signal. The second gain coefficient may be calculated with one or more gain coefficient calculations similar to those applied to the first signal. A common gain coefficient may be selected from one of the first gain coefficient and the second gain coefficient. Selecting a common gain coefficient may comprise selecting a gain coefficient from the first gain coefficient and the second gain coefficient that will result in a least amount of audio signal modification. The selected common gain coefficient may be applied to each of the first audio signal and the second audio signal.

Figure 1:
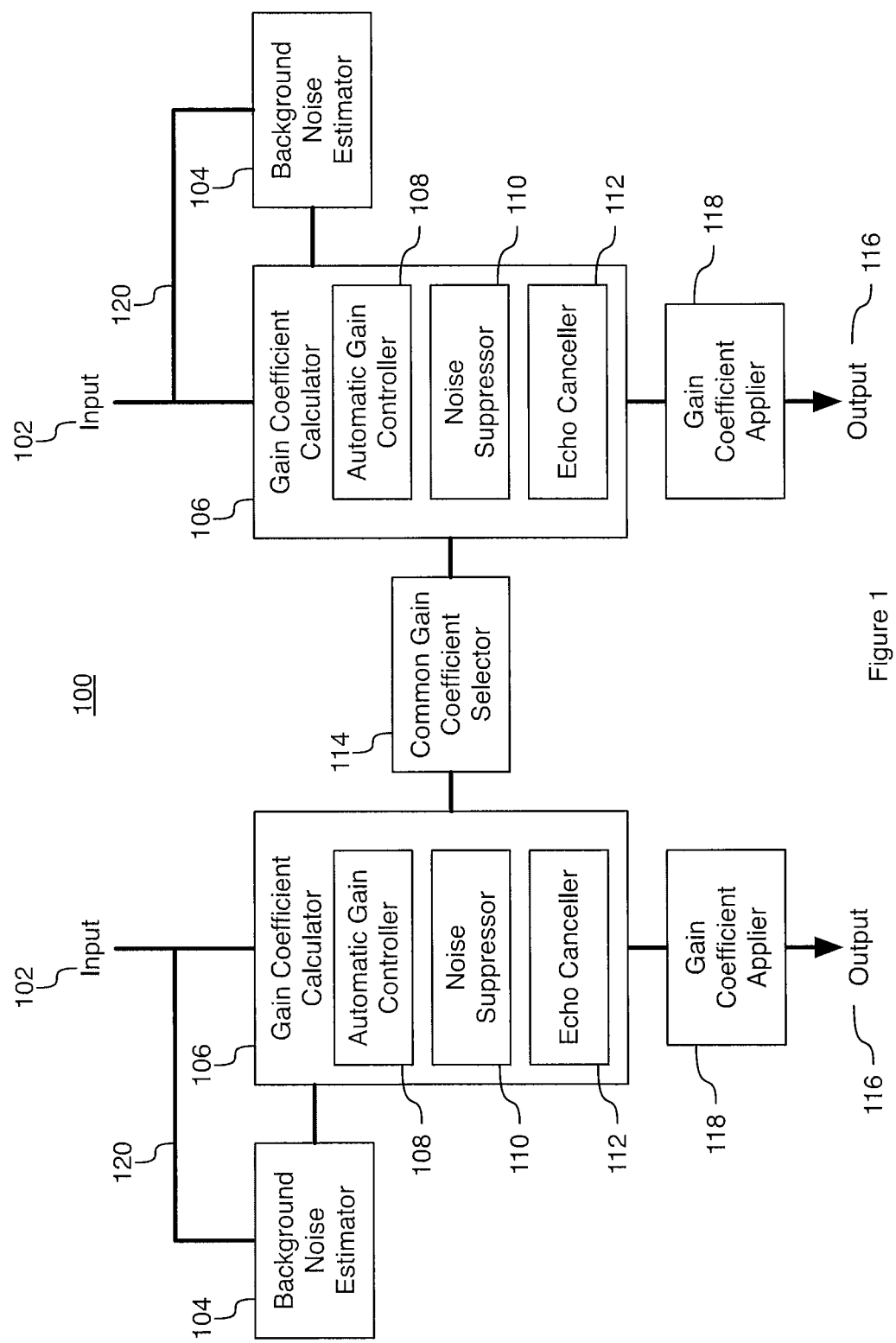
FIG. 1 is a schematic representation of a system for maintaining the spatial stability of a sound field.

FIG. 1 is a schematic representation of a system for maintaining the spatial stability of a sound field. Two or more inputs 102, or audio inputs 102, may receive the sound field. Stereo and multichannel input configurations may be utilized for processing the sound field that is a spatial representation of an audible environment associated. The audible environment may be associated with microphones on a local computing device or a remote computing device. The remote computing device may transmit audio signals 120 to the local computing device that may utilize the received audio signals 120 as inputs 102. Many audible environments associated with the inputs 102 may include undesirable content that may be mitigated by processing the received sound field. Microphones that are arranged in a far field configuration typically receive more undesirable content (a.k.a. noise) than microphones in a near field configuration. Far field configurations may include, for example, a hands free phone, a conference phone and microphones embedded into an automobile. Far field configurations are capable of receiving a sound field that represents the spatial environment associated with the microphones. Near field configurations typically place the microphone in close proximity to a user. Undesirable content may be mitigated in both near and far field configurations by processing the received sound field.

Processing that may mitigate undesirable content received in the sound field may include a gain coefficient calculator 106. The gain coefficient calculator 106 may comprise one or more of a noise suppressor 110 and an echo canceller 112. The echo canceller 112, noise suppressor 110 and other audio processing processes may calculate one or more gain coefficients. Each respective gain coefficient may be applied individually or a composite gain coefficient may be applied to process the sound field using a gain coefficient applier 118.

The echo canceller 112 mitigates echoes caused by signal feedback between two or more communication devices. Signal feedback occurs when an audio transducer on a first communication device reproduces the signal received from a second communication device and subsequently the microphones on the first communication device recapture the reproduced signal. The recaptured signal may be transmitted to the second communication device where the recaptured signal may be perceived as an echo of the previously transmitted signal. The echo canceller 112 may detect when the signal has been recaptured and attempt to suppress the recaptured signal. Many different types of echo cancellers 112 may mitigate echoes by calculating one or more gain coefficients that, when applied to the signals received by the microphone, suppress the echoes. In one example implementation, the echo suppressor 112 may calculate gain coefficients using a coherence calculation between near and far signals disclosed in U.S. Pat. No. 8,036,879, which is incorporated herein by reference, except that in the event of any inconsistent disclosure or definition from the present specification, the disclosure or definition herein shall be deemed to prevail.

When the microphone, or source of input 102, and an audio transducer are close in proximity, the echo canceller 112 may determine that a large amount of suppression may mitigate the signal produced by the audio transducer from dominating, or coupling with, the microphone. The echo canceller 112 may calculated large gain coefficients to mitigate the coupling. The large gain coefficients may result in a gating effect where the communication device effectively supports only half duplex communication. Half duplex communication may occur when the communication channel allows for reliable communication from alternatively either the far side or near side but not both simultaneously. The large gain coefficients may suppress the coupling but may also suppress all content, including desired voice content resulting in half duplex communication.

Background noise is another type of undesirable signal content that may be mitigated by processing the input 102. Many different types of noise suppressor 110 techniques may mitigate background noise. An exemplary noise suppressor 110 is a recursive Wiener filter. The Wiener suppression gain $G_{i,k}$, or gain coefficient, is defined as:

$$G_{i,k} = \frac{S\hat{N}R_{priori_{i,k}}}{S\hat{N}R_{priori_{i,k}} + 1}. \quad (1)$$

Where $S\hat{N}R_{priori_{i,k}}$ is the a priori SNR estimate and is calculated recursively by:

$$S\hat{N}R_{priori_{i,k}} = G_{i-1,k}S\hat{N}R_{post_{i,k}} - 1. \quad (2)$$

Where $S\hat{N}R_{post_{i,k}}$ is the a posteriori SNR estimate given by:

$$S\hat{N}R_{post_{i,k}} = \frac{|Y_{i,k}|^2}{|\hat{N}_{i,k}|^2}. \quad (3)$$

Where $|\hat{N}_{i,k}|$ is a background noise estimate. A background noise estimator 104 may estimate the background noise estimate. In one example implementation, the background noise estimate, or signal values, may be calculated using the background noise estimation techniques disclosed in U.S. Pat. No. 7,844,453, which is incorporated herein by reference, except that in the event of any inconsistent disclosure or definition from the present specification, the disclosure or definition herein shall be deemed to prevail. In other implementations, alternative background noise estimation techniques may be used, such as, for example, a noise power estimation technique based on minimum statistics.

An automatic gain controller 108 may calculate gain coefficients that may mitigate changing energy levels of the desired signal content. For example, the energy level of a user speaking into the microphone may change over time as the microphone may change position relative to the user. The gain coefficients calculated by the automatic gain controller 108 may mitigate the perception of the microphone changing position when applied to the input 102. In one example implementation, the automatic gain controller 108 may calculate gain coefficients using the gain controller techniques disclosed in U.S. Pat. No. 8,116,485, which is incorporated herein by reference, except that in the event of any inconsistent disclosure or definition from the present specification, the disclosure or definition herein shall be deemed to prevail.

The gain coefficient calculators 106 including the automatic gain controller 108, the noise suppressor 110 and the echo canceller 112 described above may be responsive to a background noise estimate generated by the background noise estimator 104. The automatic gain controller 108 may utilize the background noise estimate to calculate gain coefficients that may be adjusted when signal energy exceeds the background noise estimate resulting in less background noise being amplified. The echo canceller 112 may utilize the background noise estimate to calculate gain coefficients when the echoes exceed the background noise estimate by a threshold. The background noise estimator 104 may calculate a background noise estimate for each input 102.

When the inputs 102 are generated by physically separated microphones, or when two or more inputs 102 do not contain identical signal content, the background noise estimator 104 and the gain coefficient calculator 106 may calculate different background noise estimates and gain coefficients. Differences between the first gain coefficients applied to the first input 102 and second gain coefficients applied to the second input 102 may cause a distortion in the spatial image when reproduced in the output 116. Different gain coefficients applied to the first input 102 and the second input 102 may result in a shifting spatial image that may be distracting to a listener.

A common gain coefficient selector 114 may mitigate some distortion in the spatial image by selecting a first gain coefficient or a second gain coefficient that may be applied to both the first input 102 and the second input 102. Applying the same gain coefficient to all inputs 102 may mitigate distortions in the spatial image. The largest or the smallest gain coefficient may be selected. Alternatively, a combination of the gain coefficients may be calculated. For example, when the first input 102 contains a larger echo than the second input 102, an average gain coefficient may be calculated to perceptibly remove the larger echo. In another alternative, the common gain coefficient selector 114 may select the gain coefficient that will result in a least amount of audio signal modification. For example, the echo canceller 112 may calculate a first gain coefficient for application to the first input 102 that is larger than a second gain coefficient for application to the second input 102. The larger gain coefficient may result in a lower energy signal to reduce the amount of echo in the first input 102. The common gain coefficient selector 114 may select the smaller gain coefficient for application to both the first input 102 and the second input 102 resulting in less echo suppression while mitigating distortions in the spatial image. The common gain coefficient selector 114 may utilize two or more inputs 102 where the selected gain coefficient is applied to the two or more input 102. For example, the common gain coefficient selector 114 in addition to the first input 102 and the second input 102 may process a third input 102 and their respective calculated gain coefficients.

The common gain coefficient selector 114 may not apply to all types of gain coefficient calculators 106. For example, some types of noise reduction processes may require additional processing to mitigate distortions in the spatial image. A first input 102 that contains significant wind noise may have wind noise reduction applied while the second input 102 has no wind noise reduction applied. The common gain coefficient selector 114 may not mitigate the wind noise that may be more distorting than a shift in the spatial image. In one implementation, wind noise suppression gains (a.k.a. gain coefficients) may be calculated using the system for suppressing wind noise disclosed in U.S. Pat. No. 7,885,420, which is incorporated herein by reference, except that in the event of any inconsistent disclosure or definition from the present specification, the disclosure or definition herein shall be deemed to prevail. In another example, when the microphone and audio transducer are coupled as described above resulting in a gating effect, the common gain coefficient selector 114 may not be utilized because the audible artifacts associated with the coupling are perceptibly more distracting than distorting the spatial image.

A subband filter may process the received input 102 to extract frequency information. The subband filter may be accomplished by various methods, such as a Fast Fourier Transform (FFT), critical filter bank, octave filter band, or one-third octave filter bank. Alternatively, the subband analysis may include a time-based filter bank. The time-based filter bank may be composed of a bank of overlapping bandpass filters, where the center frequencies have non-linear spacing such as octave, $3^{rd}$ octave, bark, mel, or other spacing techniques. The one or more gain coefficients may be calculated for each frequency bin or band of the subband filter. The gain coefficients and the selected gain coefficients may be filtered, or smoothed, over time and/or frequency.

Figure 2:
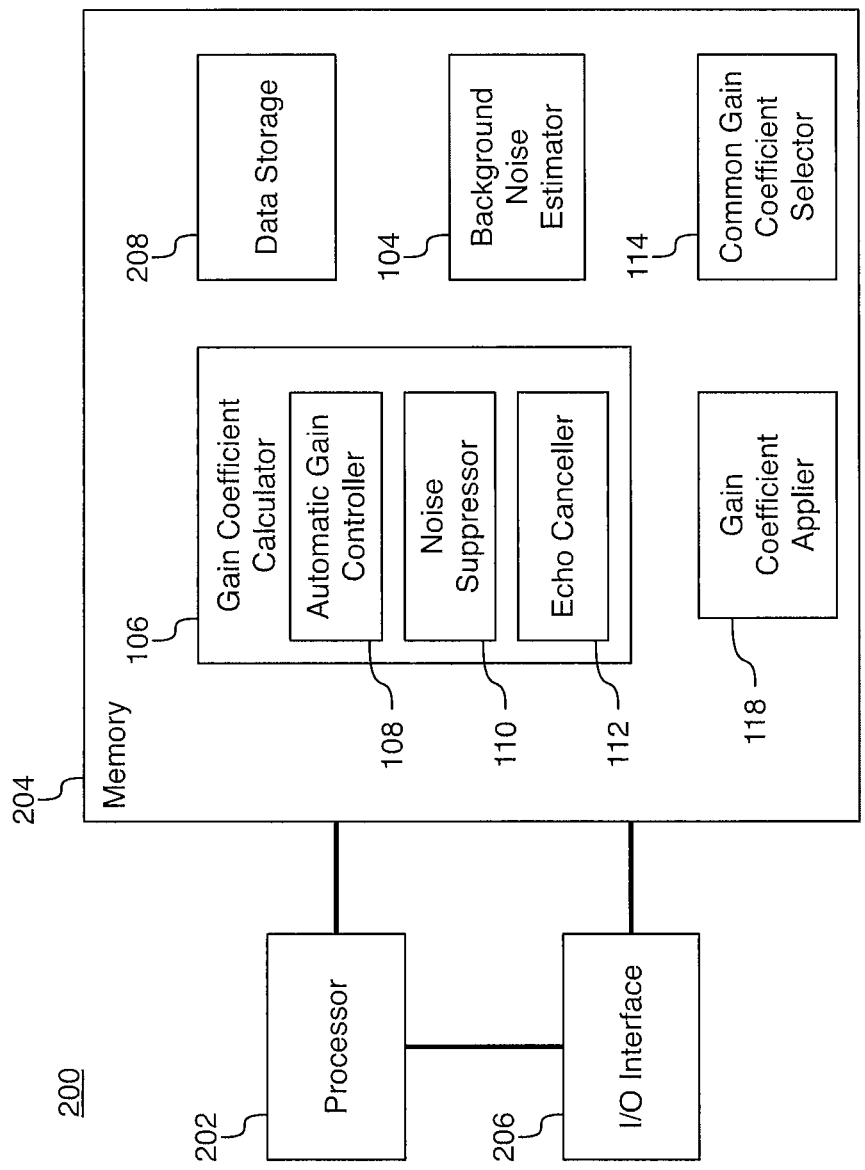
FIG. 2 is a further schematic representation of a system for maintaining the spatial stability of the sound field.
Figure 3:
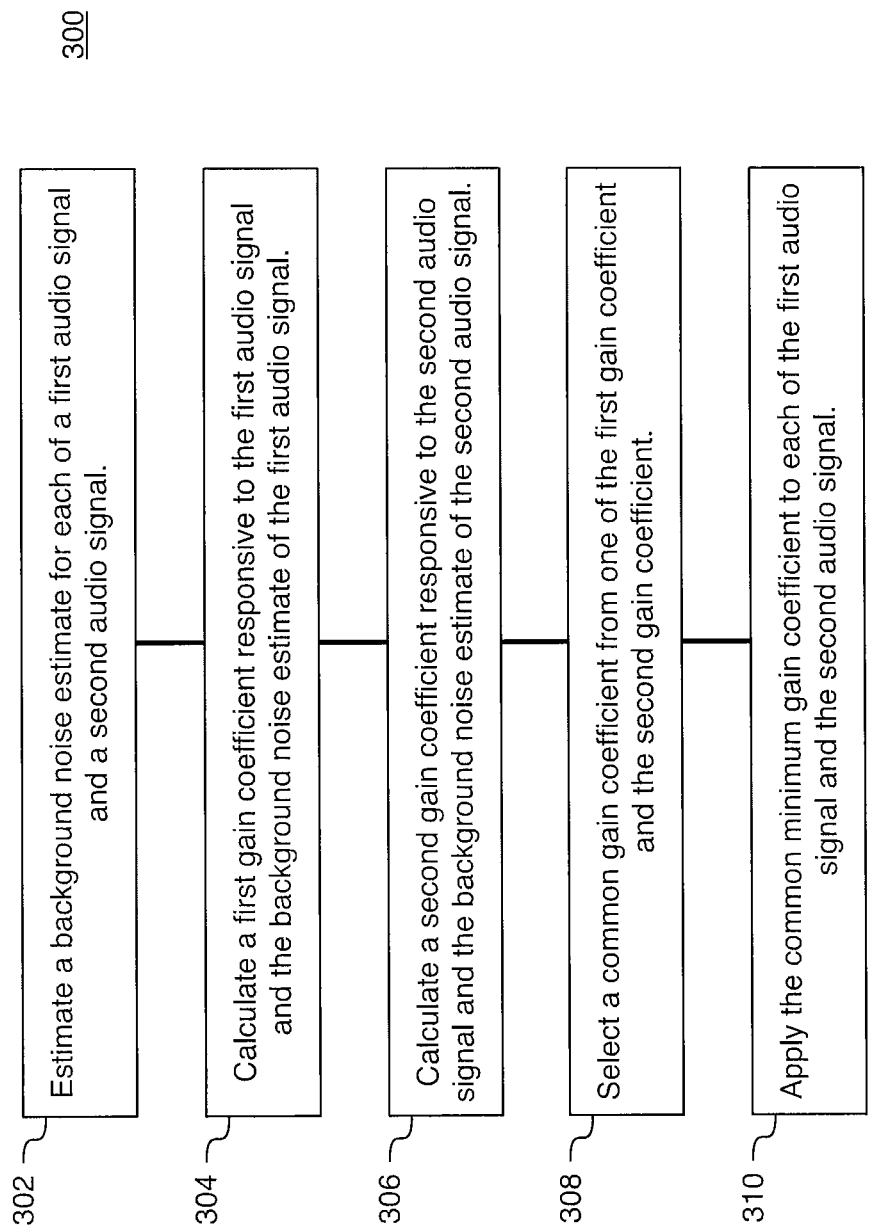
FIG. 3 is flow diagram representing a method for maintaining the spatial stability of the sound field.
Figure 4:
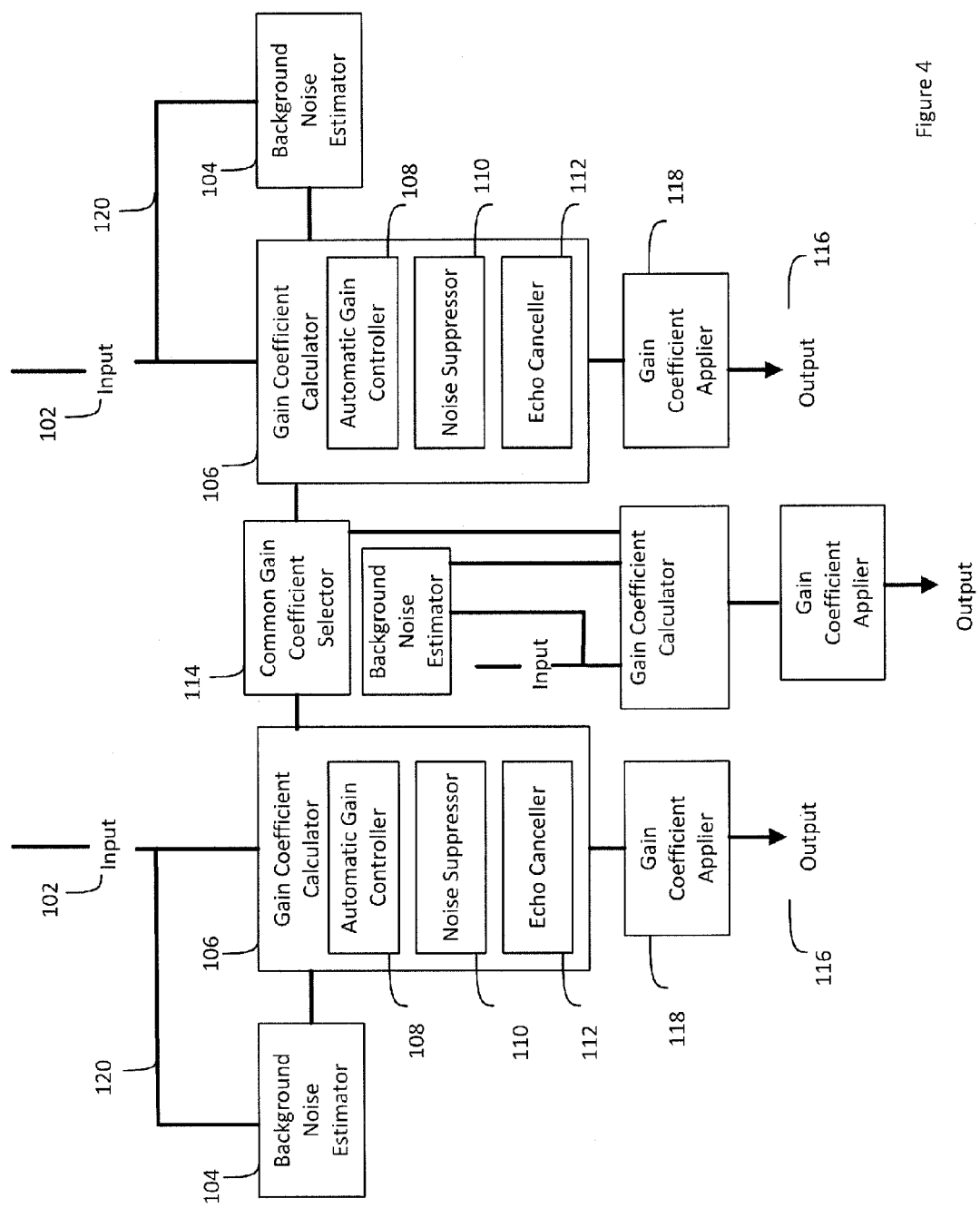
FIG. 4 is a schematic representation of a system for maintaining the spatial stability of a sound field.

FIG. 3 is flow diagram representing a method for maintaining the spatial stability of the sound field. The method 300 may be, for example, implemented using the systems 100 and 200 described herein with reference to FIGS. 1 and 2. The method 300 may include the following acts. Estimating a background noise estimate for each of a first audio signal and a second audio signal 302. Calculating a first gain coefficient responsive to the first audio signal and the background noise estimate of the first audio signal 304. The gain coefficients may be calculated using a gain coefficient calculator that may include one or more of an automatic gain controller, a noise suppressor and an echo canceller. Calculating a second gain coefficient responsive to the second audio signal and the background noise estimate of the second audio signal 306. The second gain coefficient may be calculated with one or more of the same gain coefficient calculations similar to those applied to the first signal. Selecting a common gain coefficient from one of the first gain coefficient and the second gain coefficient 308. Selecting the common gain coefficient may comprise selecting a gain coefficient from the first gain coefficient and the second gain coefficient that will result in a least amount of audio signal modification. Applying the selected common gain coefficient to each of the first audio signal and the second audio signal 310.

FIG. 2 is a further schematic representation of a system for maintaining the spatial stability of a sound field. The system 200 comprises a processor 202, memory 204 (the contents of which are accessible by the processor 202) and an I/O interface 206. The memory 204 may store instructions which when executed using the processor 202 may cause the system 200 to render the functionality associated with the system for maintaining the spatial stability of the sound field as described herein. In addition the memory 204 may store instructions which when executed using the processor 202 may cause the system 200 to render the functionality associated with the background noise estimator 104, the gain coefficient calculator 106, the automatic gain controller 108, the noise suppressor 110, the echo canceller 112, the common gain coefficient selector 114 and the gain coefficient applier 118 described herein. In addition, data structure, temporary variables and other information may be stored in data storage 208.

The processor 202 may comprise a single processor or multiple processors that may be disposed on a single chip, on multiple devices or distributed over more that one system. The processor 202 may be hardware that executes computer executable instructions or computer code embodied in the memory 204 or in other memory to perform one or more features of the system. The processor 202 may include a general purpose processor, a central processing unit (CPU), a graphics processing unit (GPU), an application specific integrated circuit (ASIC), a digital signal processor (DSP), a field programmable gate array (FPGA), a digital circuit, an analog circuit, a microcontroller, any other type of processor, or any combination thereof.

The memory 204 may comprise a device for storing and retrieving data, processor executable instructions, or any combination thereof. The memory 204 may include non-volatile and/or volatile memory, such as a random access memory (RAM), a read-only memory (ROM), an erasable programmable read-only memory (EPROM), or a flash memory. The memory 204 may comprise a single device or multiple devices that may be disposed on one or more dedicated memory devices or on a processor or other similar device. Alternatively or in addition, the memory 204 may include an optical, magnetic (hard-drive) or any other form of data storage device.

The memory 204 may store computer code, such as the background noise estimator 104, the gain coefficient calculator 106, the automatic gain controller 108, the noise suppressor 110, the echo canceller 112, the common gain coefficient selector 114 and the gain coefficient applier 118 as described herein. The computer code may include instructions executable with the processor 202. The computer code may be written in any computer language, such as C, C++, assembly language, channel program code, and/or any combination of computer languages. The memory 204 may store information in data structures including, for example, the gain coefficients.

The I/O interface 206 may be used to connect devices such as, for example, the input 102 and output 116 to other components of the system 200.

All of the disclosure, regardless of the particular implementation described, is exemplary in nature, rather than limiting. The systems 100 and 200 may include more, fewer, or different components than illustrated in FIGS. 1 and 2. Furthermore, each one of the components of systems 100 and 200 may include more, fewer, or different elements than is illustrated in FIGS. 1 and 2. Flags, data, databases, tables, entities, and other data structures may be separately stored and managed, may be incorporated into a single memory or database, may be distributed, or may be logically and physically organized in many different ways. The components may operate independently or be part of a same program or hardware. The components may be resident on separate hardware, such as separate removable circuit boards, or share common hardware, such as a same memory and processor for implementing instructions from the memory. Programs may be parts of a single program, separate programs, or distributed across several memories and processors.

The functions, acts or tasks illustrated in the figures or described may be executed in response to one or more sets of logic or instructions stored in or on computer readable media. The functions, acts or tasks are independent of the particular type of instructions set, storage media, processor or processing strategy and may be performed by software, hardware, integrated circuits, firmware, micro code and the like, operating alone or in combination. Likewise, processing strategies may include multiprocessing, multitasking, parallel processing, distributed processing, and/or any other type of processing. In one embodiment, the instructions are stored on a removable media device for reading by local or remote systems. In other embodiments, the logic or instructions are stored in a remote location for transfer through a computer network or over telephone lines. In yet other embodiments, the logic or instructions may be stored within a given computer such as, for example, a CPU.

While various embodiments of the system and method for maintaining the spatial stability of a sound field have been described, it will be apparent to those of ordinary skill in the art that many more embodiments and implementations are possible within the scope of the present invention. Accordingly, the invention is not to be restricted except in light of the attached claims and their equivalents.

The invention claimed is:

1. A computer implemented method for maintaining the spatial stability of a sound field comprising:
   estimating a background noise estimate for each of a first audio signal and a second audio signal;
   calculating a first gain coefficient responsive to the first audio signal and the background noise estimate of the first audio signal;
   calculating a second gain coefficient responsive to the second audio signal and the background noise estimate of the second audio signal;
   selecting a common gain coefficient from the first gain coefficient and the second gain coefficient; and
   applying the selected common gain coefficient to each of the first audio signal and the second audio signal.

2. The method for maintaining the spatial stability of a sound field of claim 1, where selecting the common gain coefficient comprises selecting a gain coefficient, from the first gain coefficient and the second gain coefficient, that will result in a least amount of audio signal modification.

3. The method for maintaining the spatial stability of a sound field of claim 1, where selecting the common gain coefficient comprises selecting a gain coefficient, from the first gain coefficient and the second gain coefficient, that will result in a greatest amount of audio signal modification.

4. The method for maintaining the spatial stability of a sound field of claim 1, further comprising:
   estimating a background noise estimate for a third audio signal;
   calculating a third gain coefficient responsive to the third audio signal and the background noise estimate of the third audio signal;
   selecting the common gain coefficient from the first gain coefficient, the second gain coefficient and the third gain coefficient; and
   applying the selected common gain coefficient to each of the first audio signal, the second audio signal and the third audio signal.

5. The method for maintaining the spatial stability of a sound field of claim 1, where calculating each of the first gain coefficient and the second gain coefficient includes one or more of a noise suppression calculation, an echo cancellation calculation and an automatic gain control calculation.

6. The method for maintaining the spatial stability of a sound field of claim 1, further comprising generating a set of sub-bands for each of the first audio signal and the second audio signal using a subband filter or a Fast Fourier Transform.

7. The method for maintaining the spatial stability of a sound field of claim 1, further comprising generating a set of sub-bands for each of the first audio signal and the second audio signal according to a critical, octave, mel, or bark band spacing technique.

8. A computer implemented method of maintaining the spatial stability of a sound field comprising:
   estimating a background noise estimate for each of a first audio signal and a second audio signal;
   calculating a first gain coefficient responsive to the first audio signal and the background noise estimate of the first audio signal;
   calculating a second gain coefficient responsive to the second audio signal and the background noise estimate of the second audio signal;
   selecting a common gain coefficient from the first gain coefficient and the second gain coefficient; and
   applying the selected common gain coefficient to each of the first audio signal and the second audio signal
   where selecting the common gain coefficient comprises averaging a gain coefficient, from the first gain coefficient and the second gain coefficient, that will result in a combined average amount of audio signal modification.

9. A system for maintaining the spatial stability of a sound field comprising:
   a background noise estimator to estimate a background noise estimate for each of a first audio signal and a second audio signal;
   a gain coefficient calculator to calculate a first gain coefficient responsive to the first audio signal and the background noise estimate of the first audio signal and to calculate a second gain coefficient responsive to the second audio signal and the background noise estimate of the second audio signal;
   a common gain coefficient selector to select a common gain coefficient from the first gain coefficient and the second gain coefficient; and
   a gain coefficient applier to apply the selected common gain coefficient to each of the first audio signal and the second audio signal.

10. The system for maintaining the spatial stability of a sound field of claim 9, where the common gain coefficient selector comprises selecting a gain coefficient, from the first gain coefficient and the second gain coefficient, that will result in a least amount of audio signal modification.

11. The system for maintaining the spatial stability of a sound field of claim 9, where the common gain coefficient selector comprises selecting a gain coefficient, from the first gain coefficient and the second gain coefficient, that will result in a greatest amount of audio signal modification.

12. The system for maintaining the spatial stability of a sound field of claim 9, where:
   the background noise estimator further to estimate a background noise estimate for a third audio signal;
   the gain coefficient calculator further to calculate a third gain coefficient responsive to the third audio signal and the background noise estimate of the third audio signal;
   the common gain coefficient selector further to select the common gain coefficient from the first gain coefficient, the second gain coefficient and the third gain coefficient; and
   the gain coefficient applier further to apply the selected common gain coefficient to each of the first audio signal, the second audio signal and the third audio signal.

13. The system for maintaining the spatial stability of a sound field of claim 9, where calculating each of the first gain coefficient and the second gain coefficient includes one or more of a noise suppression calculation, an echo cancellation calculation and an automatic gain control calculation.

14. The system for maintaining the spatial stability of a sound field of claim 9, further comprising means to generate a set of sub-bands for each of the first audio signal and the second audio signal using a subband filter or a Fast Fourier Transform.

15. The system for maintaining the spatial stability of a sound field of claim 9, further comprising means to generate a set of sub-bands for each of the first audio signal and the second audio signal according to a critical, octave, mel, or bark band spacing technique.

16. A system for maintaining the spatial stability of a sound field comprising:
- a background noise estimator to estimate a background noise estimate for each of a first audio signal and a second audio signal;
- a gain coefficient or to calculate a first gain coefficient responsive to the first audio signal and the background noise estimate of the first audio signal and to calculate a second gain coefficient responsive to the second audio signal and the background noise estimate of the second audio signal;
- a common gain coefficient selector to select a common gain coefficient from the first gain coefficient and the second gain coefficient; and
- a gain coefficient applier to apply the selected common gain coefficient to each of the first audio signal and the second audio signal where the common gain coefficient selector comprises averaging a gain coefficient, from the first gain coefficient and the second gain coefficient, that will result in a combined average amount of audio signal modification.

17. A computer implemented method for maintaining the spatial stability of a sound field comprising:
- estimating a first background noise estimate for a first audio signal;
- estimating a second background noise estimate from a second audio signal separate from the first background noise estimate;
- calculating a first gain coefficient responsive to the first audio signal and the first background noise estimate of the first audio signal;
- calculating a second gain coefficient responsive to the second audio signal and the second background noise estimate of the second audio signal;
- selecting a common gain coefficient from and responsive to the first gain coefficient and the second gain coefficient; and
- applying the selected common gain coefficient to each of the first audio signal and the second audio signal.

18. The computer implemented method of claim 17 where the second background estimate is not based on the first audio signal.

* * * * *

UNITED STATES PATENT AND TRADEMARK OFFICE
CERTIFICATE OF CORRECTION

PATENT NO.         : 9,210,505 B2                                              Page 1 of 1
APPLICATION NO.    : 13/753211
DATED              : December 8, 2015
INVENTOR(S)        : Hetherington It is certified that error appears in the above-identified patent and that said Letters Patent is hereby corrected as shown below:

<u>In the Claims</u>

Column 7, claim 8, line 61, after "implemented method" replace "of" with --for--.

Column 9, claim 16, line 6, after "a gain coefficient" replace "or" with --calculator--.

Signed and Sealed this
Twenty-ninth Day of March, 2016

Michelle K. Lee
*Director of the United States Patent and Trademark Office*